United States Patent
Chauhan et al.

(10) Patent No.: US 7,613,853 B2
(45) Date of Patent: Nov. 3, 2009

(54) OUTPUT BUFFER CIRCUIT CAPABLE OF SYNCHRONOUS AND ASYNCHRONOUS DATA BUFFERING USING SENSING CIRCUIT, AND METHOD AND SYSTEM OF SAME

(75) Inventors: Rajat Chauhan, Uttaranchal (IN); Rajesh Kaushik, Haryana (IN)

(73) Assignee: STMicroelectronics Pvt. Ltd., Noida, Uttar Pradesh (IN)

( * ) Notice: Subject to any disclaimer, the term of this patent is extended or adjusted under 35 U.S.C. 154(b) by 455 days.

(21) Appl. No.: 10/973,812

(22) Filed: Oct. 25, 2004

(65) Prior Publication Data
US 2005/0146367 A1 Jul. 7, 2005

(30) Foreign Application Priority Data
Oct. 24, 2003 (IN) .......... 1320/DEL/2003

(51) Int. Cl.
G06F 3/00 (2006.01)
(52) U.S. Cl. .......... 710/61; 710/52; 365/207; 365/227; 326/82; 326/83; 326/96
(58) Field of Classification Search .......... 365/207, 365/227 LTS; 710/52, 58, 61 LTS; 326/82, 326/93, 96 LTS; 713/300–323, 400–600 LTS; 327/199 LTS
See application file for complete search history.

(56) References Cited

U.S. PATENT DOCUMENTS

| | | | | |
|---|---|---|---|---|
| 4,379,327 A | * | 4/1983 | Tietjen et al. ......... | 710/61 |
| 4,644,185 A | * | 2/1987 | Todd ......... | 327/208 |
| 5,191,243 A | * | 3/1993 | Shen et al. ......... | 326/37 |
| 5,343,428 A | * | 8/1994 | Pilo et al. ......... | 365/189.05 |
| 5,563,843 A | * | 10/1996 | Fackenthal et al. ......... | 365/193 |
| 5,793,698 A | * | 8/1998 | Komarek et al. ......... | 365/230.08 |
| 5,850,359 A | * | 12/1998 | Liu ......... | 365/156 |
| 6,028,448 A | * | 2/2000 | Landry ......... | 326/58 |
| 6,104,209 A | * | 8/2000 | Keeth et al. ......... | 326/83 |
| 6,151,648 A | * | 11/2000 | Haq ......... | 710/107 |
| 6,353,334 B1 | * | 3/2002 | Schultz et al. ......... | 326/82 |
| 6,845,055 B1 | * | 1/2005 | Koga et al. ......... | 365/229 |
| 6,891,394 B1 | * | 5/2005 | Yu et al. ......... | 326/38 |
| 7,076,677 B2 | | 7/2006 | Falconer et al. ......... | 713/400 |

OTHER PUBLICATIONS

JEDEC Solid State Technology Association 2002, ERRATA to JEDEC Standard, JEDEC, Oct. 18, 2002, pp. 11-14.*

* cited by examiner

*Primary Examiner*—Eron J Sorrell
(74) *Attorney, Agent, or Firm*—Lisa K. Jorgensen; Paul F. Rusyn; Graybeal Jackson LLP

(57) ABSTRACT

An improved output buffer having single ended as well as differential signaling capabilities, providing symmetrical outputs for differential output configurations for both synchronous and asynchronous applications, comprising: a pair of flip-flops receiving complementary input signals, a pair of transmitters each having its input connected to the output of one of the flip-flops and providing its output to an output pin, a sense block that senses the transition on complementary input signals and generates a pulse at each transition, and a multiplexer having its output connected to the clock input of said pair of flip flop and one input connected to the output of the sense block for asynchronous mode operation, the second input connected to a clock signal for synchronous mode operation and a select input that enables either asynchronous mode or synchronous mode operation.

21 Claims, 5 Drawing Sheets

Figure 1: PRIOR ART

OUTPUT BUFFER CIRCUIT CAPABLE OF SYNCHRONOUS AND ASYNCHRONOUS DATA BUFFERING USING SENSING CIRCUIT, AND METHOD AND SYSTEM OF SAME

PRIORITY CLAIM

The present application claims the benefit of Indian Patent Application No. 1320/Del/2003, filed Oct. 24, 2003, which application is incorporated herein by reference in its entirety.

TECHNICAL FIELD

Embodiments of the present invention relate to output buffers. More particularly, embodiments of the present invention relate to output buffers providing differential outputs in differential transmission operation.

BACKGROUND

Standards pertaining to differential transmission define specific requirements relating to synchronization of crossover points i.e. complementary signals at the I/O pins are required to transition within a very tightly defined time difference. Asymmetric rise/fall edges, unequal rise/fall delays, delayed complementary signals can cause the differential output's cross-points to shift from the nominal position and move outside the allowed range.

To ensure synchronization of complementary signals transitions, conventional circuits use flip-flops driven by a common clock. FIG. 1 shows a prior art employed by Xilinx Field Programmable Gate Arrays (FGPAs) for an Low Voltage Differential Signals (LVDS) interface [Ref: Xilinx's U.S. Pat. No. 6,353,334 B1]. A pair of programmable output circuits 105A and 105B connect to respective output pins 106 and 108. Though not shown in the figure, each output circuit forms a part of an input/output block including input buffers and other circuitry. Output circuit 105A includes a flip-flop 115A and output buffer 120A. The data terminal of flip-flop 115A receives 'SBAR', an inverted version of signal S. The Clock terminal of the flip-flop is connected to clock line CLK and its output terminal Q is connected through output buffer 120A to pin 106.

Output circuit 105B is identical to output circuit 105A. The data terminal of flip-flop 115B receives the non-inverted version of signal S. Though not shown in the figure, the data terminals of flip-flops 115A and 115B are programmable to receive inverted or non-inverted version of signal S. Flip-flops 115A and 115B are clocked by the same clock signal CLK, and are therefore synchronized with each other. This ensures that the complementary signals on pins 106 and 108 transition at the same time independent of mismatched routing propagation delays of complementary signals S and SBAR from the signal source to the output circuits.

While the prior art has been described in connection with an LVDS interface, it will be obvious to those of skill in art that the scheme can be adapted for other types of differential signaling.

The scheme described in this prior art suffers from the drawback that it requires a clock signal for its operation thereby limiting its application to synchronous circuit configurations.

SUMMARY

An embodiment of the invention is to overcome the above drawbacks and provide an arrangement that is equally effective for synchronous as well as asynchronous circuits.

An embodiment of this invention provides an improved output buffer capable of providing symmetrical outputs for differential signaling during an asynchronous mode of operation, comprising:

a pair of flip-flops receiving complementary input signals,
  a pair of transmitters each having its input connected to the output of one of the flip-flops and providing its output to an output pin,
  a sense block that senses the transitions on said complementary input signals and provides a pulse at each transition to the clock input of said pair of flip-flops.

Further, a multiplexer may be provided between the output of the sense block and the clock input of said pair of flip-flops, said multiplexer having one input connected to the output of sense block and second input connected to a clock signal, its select input being used to select the sense block output during asynchronous mode of operation and the clock input during synchronous mode of operation.

The sense block may be a differential receiver having its inputs connected to the complementary inputs signals and its output connected to one input of said multiplexer.

For single ended applications the differential receiver has one input connected to a reference voltage while its second input is connected to the output.

Embodiments of the present invention further provide a method for improving an output buffer for enabling symmetrical outputs for differential output configurations during asynchronous operation comprising the steps of:

providing a pair of flip-flops receiving complementary input signals,
  connecting a pair of transmitters each having its input connected to the output of one of the flip-flops and providing its output to an output pin,
  sensing the transitions on the complementary input signals and generating a pulse at each transition, and
  coupling said pulse to the clock input of said pair of flip-flops.

The said coupling may be achieved by multiplexing between the transition pulses and a clock signal such that the clock input receives the transition pulses during asynchronous mode of operation and clock pulses during synchronous mode of operation.

The sensing of transitions may be achieved by connecting the inputs of a differential receiver to the complementary input signals.

BRIEF DESCRIPTION OF THE DRAWINGS

Embodiments of the invention will now be described with reference to the accompanying drawings.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
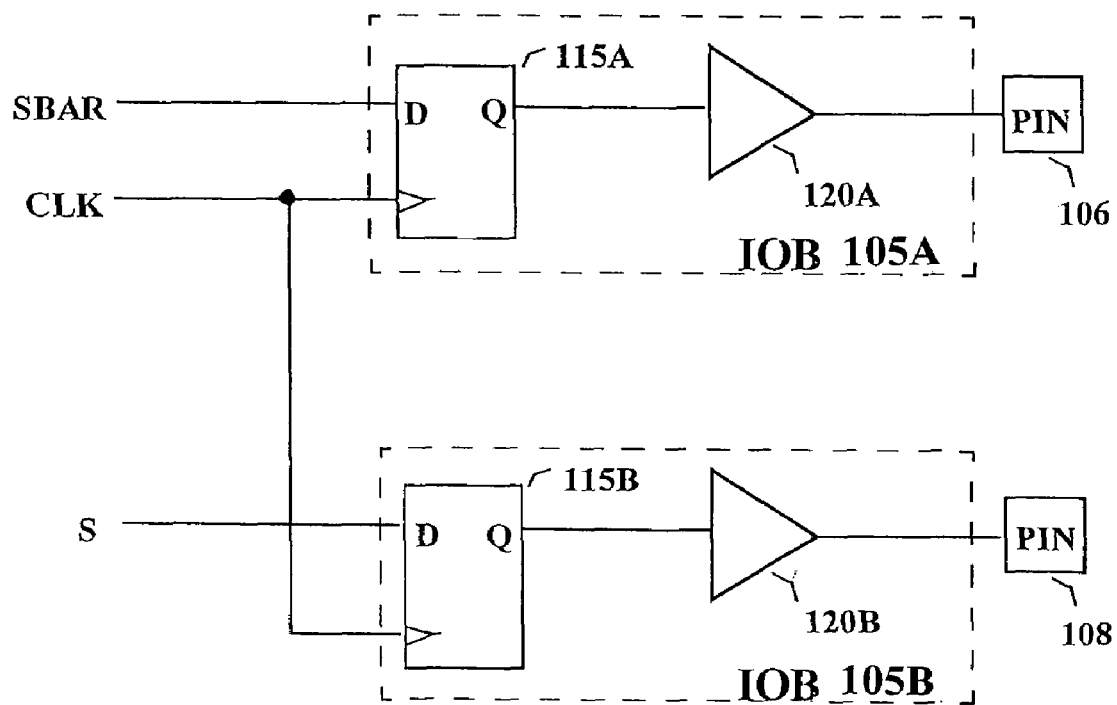
FIG. 1 shows a prior art 10 circuit in accordance with U.S. Pat. No. 6,353,334.
Figure 2:
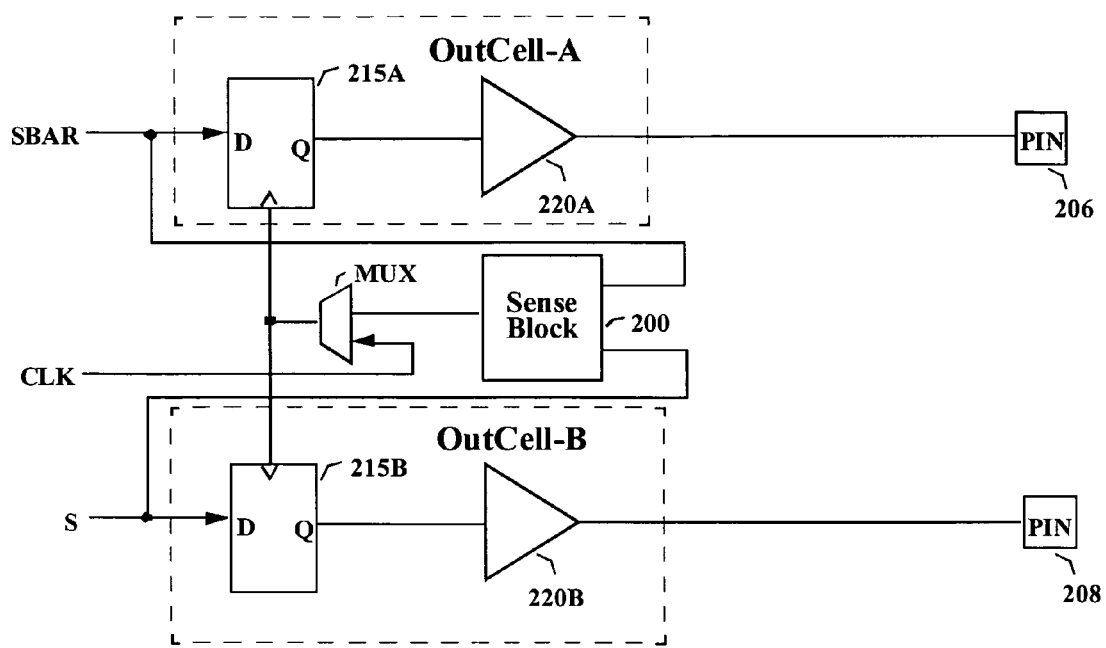
FIG. 2 shows a schematic circuit diagram in accordance with an embodiment of the present invention.

FIG. 2 shows an apparatus according to one embodiment of the present invention. It shows a pair of programmable output circuits OutCellA and OutCellB connected to respective pins 206 and 208. Though not shown in the figure, each output circuit forms a part of an input/output cell including input buffers and other circuitry.

Output circuit OutCellA includes a dual-edge triggered flip-flop 215A and transmitter 220A. The data terminal of flip-flop 215A receives 'SBAR', an inverted version of input signal S. Output terminal Q of the flip-flop is connected through transmitter 220A to pin 206. The Clock terminal of the flip-flop is connected to the output of multiplexer MUX.

The data terminal of flip-flop 215B receives the non-inverted input signal S. This Output pair also includes a multiplexer MUX and a sense block 200. MUX selects between the input CLK and output of sense block 200. Sense block 200 has its two inputs connected to complementary signals S and SBAR. Output circuit OutCellB is identical to output circuit OutCellA, with like elements being labeled using the similar names and numbers but ending with the letter "B".

In differential output synchronous mode operation, the simultaneous transition of the complementary signals at pins 206 and 208 is ensured by clocking dual-edge flip-flops 215A and 215B through the same clock CLK, in a manner similar to the technique used in the prior art. In this case multiplexer MUX selects the clock signal CLK.

To ensure simultaneous transition in asynchronous applications, this embodiment of the invention provides self-synchronization of the complementary signals. In this case multiplexer MUX connects the output of sense block 200 to the clock input of dual-edge flip-flops 215A and 215B. The sense block 200 senses the crossing of the complementary signals S and SBAR and generates a corresponding pulse edge after some time delay. Dual-edge flip-flops 215A and 215B trigger at every pulse edge (ve+ or ve−), passing the signals S and SBAR to pins 206 and 208 through transmitters 220A and 220B respectively. As transmitters 220A and 220B are identical, complementary signal S and SBAR will transition simultaneously at pins 206 and 208. The time delay of the sense block 200 ensures the setting of the complementary signals at the input 'D' of the flip-flops.

Figure 3:
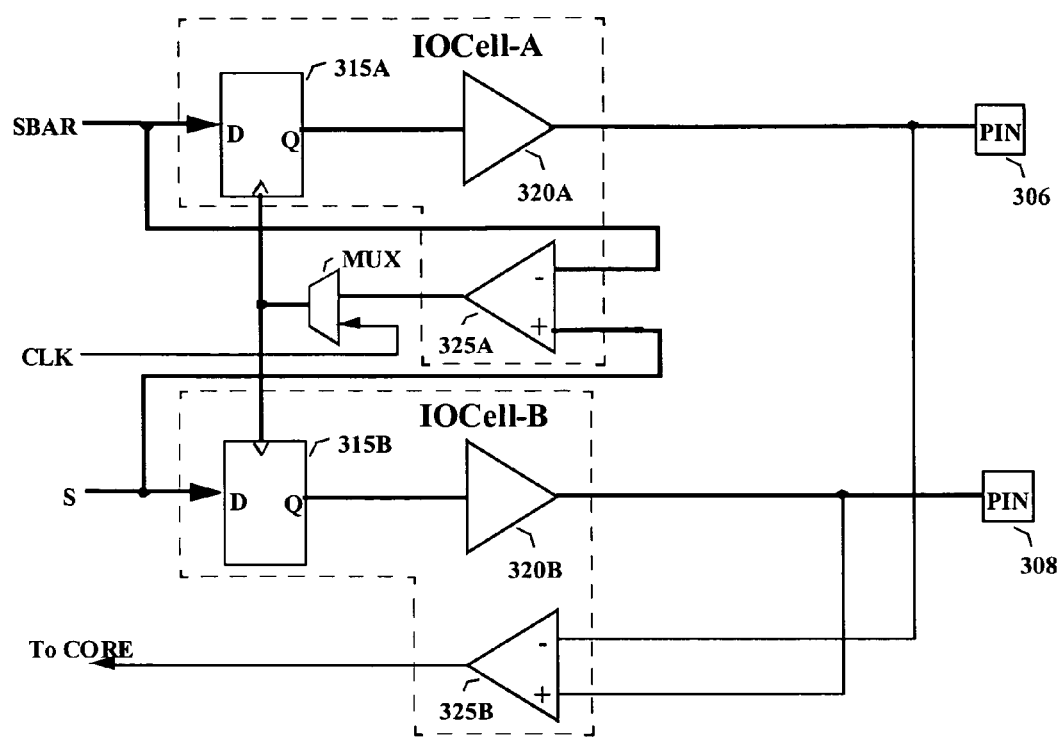
FIG. 3 shows a schematic of a circuit according to another embodiment of the present invention.

The circuit realization of the apparatus according to an embodiment of the present invention is shown in FIG. 3. This arrangement shows a pair of I/O pins with their respective programmable I/O circuits configured for differential interchange of binary signals. It includes I/O pins 306 and 308. Each pin is associated with identical I/O cells IOCell-A and IOCell-B. IOCell-A includes a transmitter 320A, differential receiver 325A and dual-edge triggered flip-flop 315A. IOCell-B includes the same components represented by the same reference number but suffixed with alphabet 'B'. A multiplexer MUX is also included with the I/O pair.

I/O pins 306 and 308 are used to receive and transmit differential signals. In input mode, differential receiver 325B receives the differential input at pins 306, 308 and converts it to a specified output signal level. In output mode, transmitters 320A and 320B are used to transmit complementary signals at pins 306 and 308 respectively. Any of the pins 306 or 308 can be programmed to transmit either inverted or non-inverted output. In the example the inverted version SBAR of the signal S is connected at pin 306, through dual-edge flip-flop 315A and transmitter 320A. The non-inverted signal S is connected to pin 308, through dual-edge flip-flop 315B and transmitter 320B.

In synchronous applications the simultaneous transition of the complementary signals at pins 306 and 308 is achieved by clocking dual-edge flip-flops 315A and 315B using a common clock signal CLK.

In asynchronous applications, differential receiver 325A is used as the sense block 200 of FIG. 2. The inputs of the differential receiver 325A are programmable for connection to either SBAR or S and the output is selected by multiplexer MUX to connect to the clock input of dual-edge flip-flops 315A and 315B.

The sense block 200 mentioned can simply be a differential comparator. If the skew between S and SBAR is slightly large, then for a short period of time S and SBAR may remain at same logic (both are high or both are low). In this period of time output of the comparator is undefined and it may or may not switch. To ensure no transition at the comparator's output hysteresis is added to the differential comparator.

Dual edge flip-flops 315A and 315B ensure simultaneous transition of complimentary signals S and SBAR as both have the same clock input which is received from the output of 325A. The switching of the output of differential receiver 325A in turn depends on signals S and SBAR. When S and SBAR change state, the output of receiver 325A switches, triggering the flip-flops 315A and 315B and thus passing the signals S and SBAR to pins 306 and 308 through transmitters 320A and 320B respectively. As transmitters 320A and 320B are identical, complementary signal S and SBAR will transition simultaneously at pins 306 and 308. It is to be noted that delay of the receiver 325A provides a setup time to the flip-flops 315A and 315B to ensure the setting of the signals S and SBAR at their inputs before they are passed to pins 306 and 308.

The simultaneous transition in asynchronous applications is ensured by triggering flip-flops through complementary signals, instead of clock CLK. The use of flip-flops ensures simultaneous transition of complementary signals on pins 306 and 308 independent of routing propagation delays of signals S and SBAR from the signal source.

It will be apparent that the only extra circuitry added is multiplexer MUX and some programming switches. Dual-edge flip-flops and differential receiver associated with each IOCell are not extra hardware. Differential receiver 325A is an unused element of the I/O pair in differential operation and is normally used to receive the signal from pin 306 in single-ended I/O operation.

Figure 4:
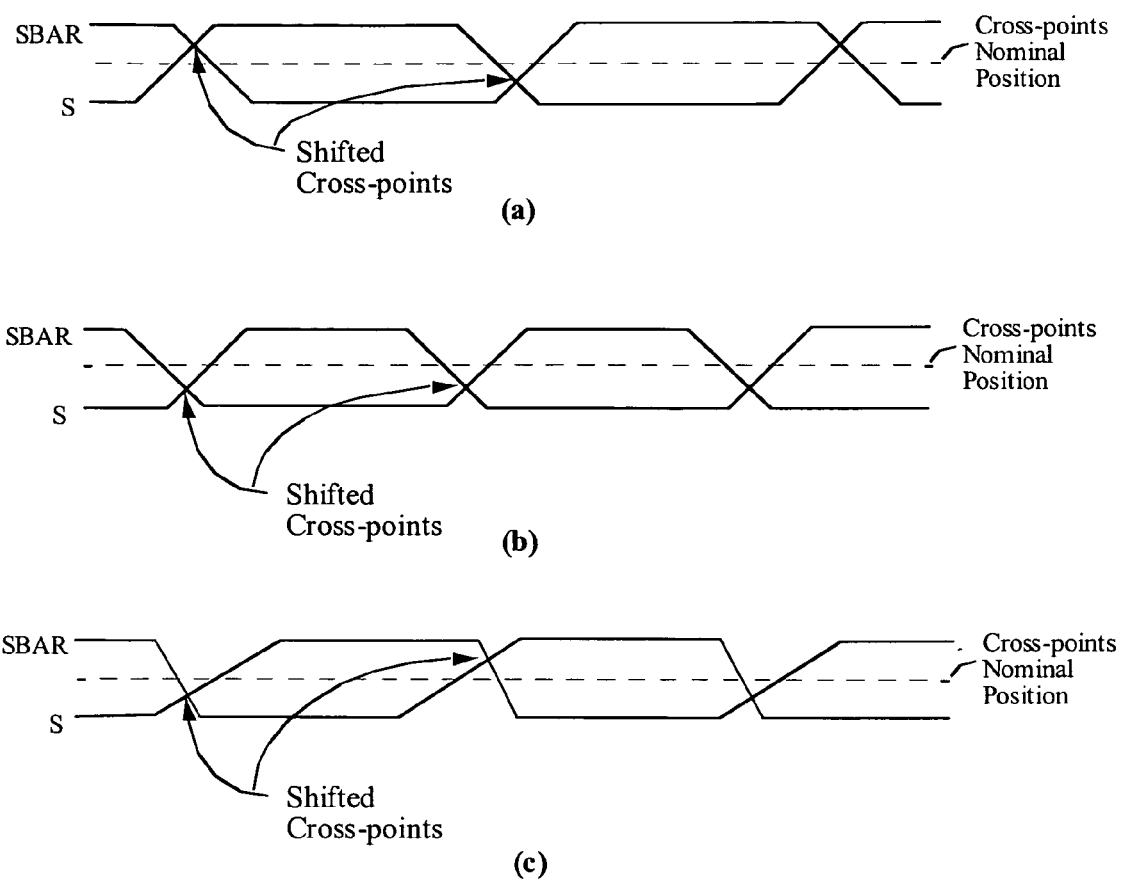
FIG. 4 shows cases of shifting of crossover points due to unbalanced complementary signal.

FIG. 4 shows cases of shifting of crossover points due to unbalanced complementary signals. FIG. 4(a) shows the shifting of cross-over points when the inverted signal SBAR is delayed with respect to the non-inverted signal S. FIG. 4(b) shows the shifting of cross-over points when both SBAR and S do not have a 50% duty cycle. In this case both SBAR and S have positive pulse duty cycle less than 50%. FIG. 4(c)

shows the shifting of cross-over points when both SBAR and S have asymmetric rising and falling edges.

Figure 5:
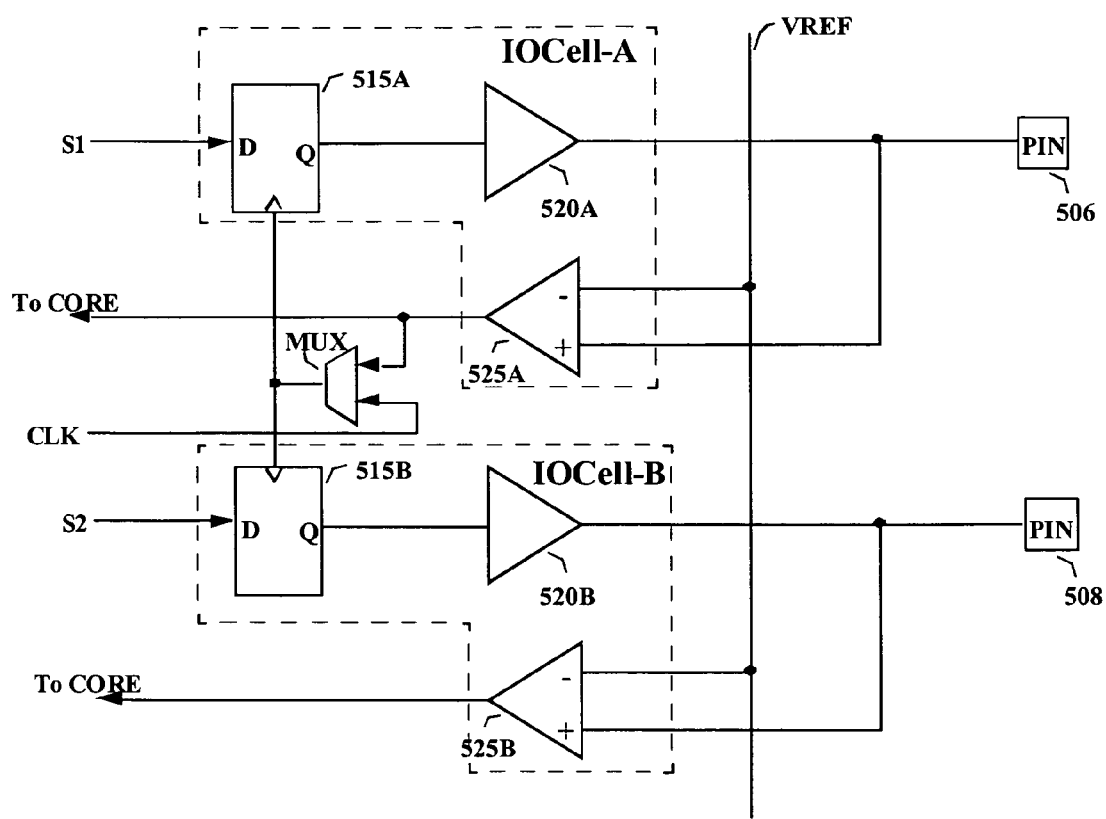
FIG. 5 shows an I/O pair configuration in single-ended operation according to one embodiment of the present invention.

FIG. 5 shows the I/O pair configuration in single-ended operation. IOCell-A and IOCell-B operate independently for single-ended interchange of binary signals. Transmitter 520A and receiver 525A transmit and receive single-ended signals respectively at pin 506 and similarly transmitter 520B and receiver 525B at pin 508. The other inputs of the differential receivers 525A and 525B are connected to reference voltage through line VREF.

It will be apparent to a person skilled in the art that though the embodiments of the invention have been described with reference to Stub Series Terminated Logic for 2.5V (SSTL2) and High-Speed Transceiver Logic (HSTL) differential operation, other embodiments can be adapted for other differential transmitter operations.

Output buffers according to embodiments of the present invention can be utilized in a variety of different types of integrated circuits, such as memory circuits like DRAMs, SRAMs, and FLASH memories. These integrated circuits may, in turn, be included in a variety of different types of electronic systems, such as computer systems From the foregoing it will be appreciated that, although specific embodiments of the invention have been described herein for purposes of illustration, various modifications may be made without deviating from the spirit and scope of the invention.

We claim:

1. An output buffer capable of providing symmetrical outputs for differential signaling, comprising:
    first and second flip-flops each having a first input, a clock input, and an output, the flip-flops operable to receive complementary input signals on their respective first inputs,
    first and second transmitters, each having an input respectively connected to the output of the first and second flip-flops and each transmitter further having an output respectively connected to first and second output pins,
    a sense block having an output and having first and second inputs operable to receive said complementary input signals and operable to provide on said sense block output, responsive to a transition on each of the complementary input signals, a pulse to the clock inputs of the first and second flip-flops.

2. The output buffer as claimed in claim 1 wherein a multiplexer is provided between the output of the sense block and the clock inputs of said first and second flip-flops, said multiplexer having a first input connected to the output of the sense block and a second input operable to receive a clock signal, the multiplexer further having a select input operable to select the sense block output during an asynchronous mode of operation and the clock input during a synchronous mode of operation.

3. The output buffer as claimed in claim 2 wherein the sense block is a differential receiver.

4. A method for an output buffer for enabling symmetrical outputs for differential output configurations comprising the steps of:
    providing first and second flip-flops operable to receive first and second complementary input signals,
    providing first and second transmitters each having a respective input connected to an output of one of the flip-flops and providing a respective output to first and second output pins,
    generating a pulse signal responsive to sensing a transition on each of the complementary input signals, and
    coupling said pulse signal to a clock input of each of said first and second flip-flops.

5. The method as claimed in claim 4 wherein said coupling is achieved by multiplexing between the transition pulses and a clock signal such that the clock input receives the pulse signal during an asynchronous mode of operation and the clock signal during a synchronous mode of operation.

6. The method as claimed in claim 4 wherein the sensing of transition is achieved by connecting the inputs of a differential receiver to the complementary input signals.

7. An output buffer circuit including first and second complementary inputs adapted to receive first and second complementary input signals, respectively, and including a clock input adapted to receive a clock signal, the output buffer operable in a synchronous mode of operation to store each of the first and second complementary input signals responsive to the clock signal and to provide the stored signals on first and second complementary outputs, respectively, and the output buffer operable in an asynchronous mode of operation to store each of the first and second complementary input signals responsive to a transition on each of the first and second complementary input signals and to provide the stored signals on the first and second complementary outputs, respectively.

8. The output buffer of claim 7 further comprising:
    first flip-flop having an input coupled to the first complementary input and an output coupled to the first complementary output, and having a first clock input;
    a second flip-flop having an input coupled to the second complementary input and an output coupled to the second complementary output, and having a second clock input;
    a sensing circuit having a first input coupled to the first complementary input of the buffer circuit, a second input coupled to the second complementary input of the buffer circuit, an input coupled to the clock input to receive the clock signal, and an output coupled to the first and second clock inputs of the first and second flip-flops, the sensing circuit operable in the synchronous mode to apply the clock signal to the first and second clock inputs and operable in the asynchronous mode to apply a pulse signal on the first and second clock inputs responsive to the transition of the first and second complementary input signals.

9. The output buffer of claim 8 wherein the sensing circuit further comprises:
    a differential receiver having a first input coupled to the first complementary output of the first flip-flop and a second input coupled to the second complementary output of the second flip-flop, and having an output; and
    a multiplexer having an output coupled to the first and second clock input, a first input coupled to the clock input, and a second input coupled to the output of the differential receiver.

10. The output buffer of claim 8 wherein the sensing circuit further comprises a multiplexer having a first input coupled to the output of a differential receiver, a second input coupled to the clock input to receive the clock signal, and wherein the multiplexer is operable to provide either the output from the differential receiver or the clock signal on an output responsive to a select signal.

11. The output buffer of claim 8 further comprising:
    a first transmitter coupled between the output of the first flip-flop and the first complementary output, wherein the output of the first flip-flop is coupled to the first complementary output through the first transmitter; and
    a second transmitter coupled between the output of the second flip-flop and the second complementary output, wherein the output of the second flip-flop is coupled to the second complementary output through the second transmitter.

12. The output buffer of claim 8 wherein the sensing circuit is further operable in the asynchronous mode to delay generating the pulse signal on the first and second clock inputs for a predetermined delay time after the transition of the first and second complementary input signals.

13. An integrated circuit, comprising:
electronic circuitry including an output buffer coupled to a first and second complementary outputs, the output buffer including,
first and second complementary inputs adapted to receive first and second complementary input signals, respectively, and including a clock input adapted to receive a clock signal, the output buffer operable in a synchronous mode of operation to store each of the first and second complementary input signals responsive to the clock signal and to provide the stored signals on the first and second complementary outputs, respectively, and the output buffer operable in an asynchronous mode of operation to store each of the first and second complementary input signals responsive to a transition on each of the first and second complementary input signals and to provide the stored signals on the first and second complementary outputs, respectively.

14. The integrated circuit of claim 13 wherein the electronic circuitry comprises memory circuitry.

15. The integrated circuit of claim 14 wherein the memory circuitry comprises DRAM circuitry.

16. A system, comprising:
an electronic subsystem including electronic circuitry, the electronic circuitry including an output buffer coupled to first and second complementary outputs, the output buffer including,
first and second complementary inputs adapted to receive first and second complementary input signals, respectively, and including a clock input adapted to receive a clock signal, the output buffer operable in a synchronous mode of operation to store each of the first and second complementary input signals responsive to the clock signal and to provide the stored signals on the first and second complementary outputs, respectively, and the output buffer operable in an asynchronous mode of operation to store each of the first and second complementary input signals responsive to a transition on each of the first and second complementary input signals and to provide the stored signals on the first and second complementary outputs, respectively.

17. The system of claim 16 wherein the electronic subsystem comprises a computer system.

18. A method of providing complementary signals, the method comprising:
receiving first and second input signals, the second input signal being representative of the logical complement of the first input signal;
detecting a first or second mode of operation;
during the first mode,
clocking the first and second input signals onto first and second respective outputs in response to an external clocking signal; and
during the second mode,
detecting a respective transition on each of the first and second complementary input signals,
generating a pulse signal responsive to said detection of said respective transition on each of the first and second input signals, and
clocking the first and second complementary input signals onto the first and second respective outputs responsive to the pulse signal.

19. The method of claim 18 wherein generating the pulse signal comprises generating the said pulse signal a predetermined delay time after said detection of said respective transition on each of the first and second complementary input signals.

20. The method of claim 19 wherein the predetermined delay time is approximately equal to a set-up time for the first and second complementary input signals.

21. The method of claim 18 wherein detecting the said first or second mode of operation comprises detecting a logic state of a select signal.

* * * * *

UNITED STATES PATENT AND TRADEMARK OFFICE
CERTIFICATE OF CORRECTION

| | |
|---|---|
| PATENT NO. | : 7,613,853 B2 |
| APPLICATION NO. | : 10/973812 |
| DATED | : November 3, 2009 |
| INVENTOR(S) | : Rajat Chauhan and Rajesh Kaushik |

Page 1 of 1

It is certified that error appears in the above-identified patent and that said Letters Patent is hereby corrected as shown below:

- In Claim 8, Column 6, Line 25 of the patent, insert the text -- a -- before the text "first flip-flop having an input".

Signed and Sealed this

Twenty-ninth Day of December, 2009

David J. Kappos
*Director of the United States Patent and Trademark Office*

UNITED STATES PATENT AND TRADEMARK OFFICE
CERTIFICATE OF CORRECTION

PATENT NO. : 7,613,853 B2
APPLICATION NO. : 10/973812
DATED : November 3, 2009
INVENTOR(S) : Chauhan et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 788 days.

Signed and Sealed this

Fourteenth Day of December, 2010

David J. Kappos
*Director of the United States Patent and Trademark Office*